(12) United States Patent
Boron et al.

(10) Patent No.: US 10,556,508 B2
(45) Date of Patent: Feb. 11, 2020

(54) ILLUMINATED CONTROL PANEL CAPACITIVE SENSOR HAVING RIGID AND FLEXIBLE PORTIONS

(71) Applicant: Aptiv Technologies Limited, St. Michael (BB)

(72) Inventors: Artur Boron, Czernichow (PL); Janusz Lipka, Warsaw (PL); Przemyslaw Madon, Cracow (PL); Sebastian Melfried, Cracow (PL); Halina Niemiec, Cracow (PL); Grzegorz Szostek, Morawica (PL)

(73) Assignee: Aptiv Technologies Limited (BB)

( * ) Notice: Subject to any disclaimer, the term of this patent is extended or adjusted under 35 U.S.C. 154(b) by 178 days.

(21) Appl. No.: 15/689,032

(22) Filed: Aug. 29, 2017

(65) Prior Publication Data

US 2018/0056788 A1 Mar. 1, 2018

(30) Foreign Application Priority Data

Aug. 29, 2016 (FR) ...................................... 1658013

(51) Int. Cl.
*B60K 37/06* (2006.01)
*G06F 3/044* (2006.01)
(Continued)

(52) U.S. Cl.
CPC .............. *B60K 37/06* (2013.01); *G06F 3/044* (2013.01); *G06F 3/0414* (2013.01);
(Continued)

(58) Field of Classification Search
CPC ............ B60K 37/06; B60K 2370/1446; B60K 2370/34; B60K 2370/143; H03K 17/9622; H03K 17/9625; H03K 17/962; H03K 2217/96079; H03K 2217/960755; H03K 2217/9602; H03K 2217/96072; H03K 2217/96075; H01H 13/83; H01H 1/029;
(Continued)

(56) References Cited

U.S. PATENT DOCUMENTS

| 7,511,242 B2 * | 3/2009 | Winkler | H03K 17/962 |
| | | | 200/511 |
| 8,531,407 B2 * | 9/2013 | Tanaka | H01H 13/83 |
| | | | 178/18.01 |
| 9,048,842 B2 * | 6/2015 | Dombrowski | H03K 17/962 |

FOREIGN PATENT DOCUMENTS

| WO | 2010/014356 A2 | 2/2010 |
| WO | 2012/085360 A1 | 6/2012 |
| WO | 2015/110722 A1 | 7/2015 |

\* cited by examiner

*Primary Examiner* — Vanessa Girardi
(74) *Attorney, Agent, or Firm* — Joseph V. Bonadies

(57) ABSTRACT

A motor vehicle control panel includes a front face including a control zone; a printed circuit board; at least one electrically conductive capacitive detection element extending along a vertical axis from the rear surface of the front face to an electrical contact zone of the printed circuit board; a light source mounted on the printed circuit board and able to produce a back lighting light beam toward the control zone through the capacitive detection element; the capacitive detection element also comprises at least one rigid tubular part forming a light guide for the light beam and at least one elastic part made in one piece with the rigid tubular part so as to compensate the clearances between the rear surface and the detection element and between the printed circuit board and the detection element.

9 Claims, 3 Drawing Sheets

(51) Int. Cl.
    *H01H 1/029*     (2006.01)
    *H03K 17/96*     (2006.01)
    *G06F 3/041*     (2006.01)
    *H01H 13/83*     (2006.01)

(52) U.S. Cl.
    CPC ............ *H01H 1/029* (2013.01); *H01H 13/83* (2013.01); *H03K 17/9625* (2013.01); *B60K 2370/143* (2019.05); *H03K 2017/9602* (2013.01)

(58) Field of Classification Search
    CPC .. H01H 2239/006; G06F 3/044; G06F 3/0414
    See application file for complete search history.

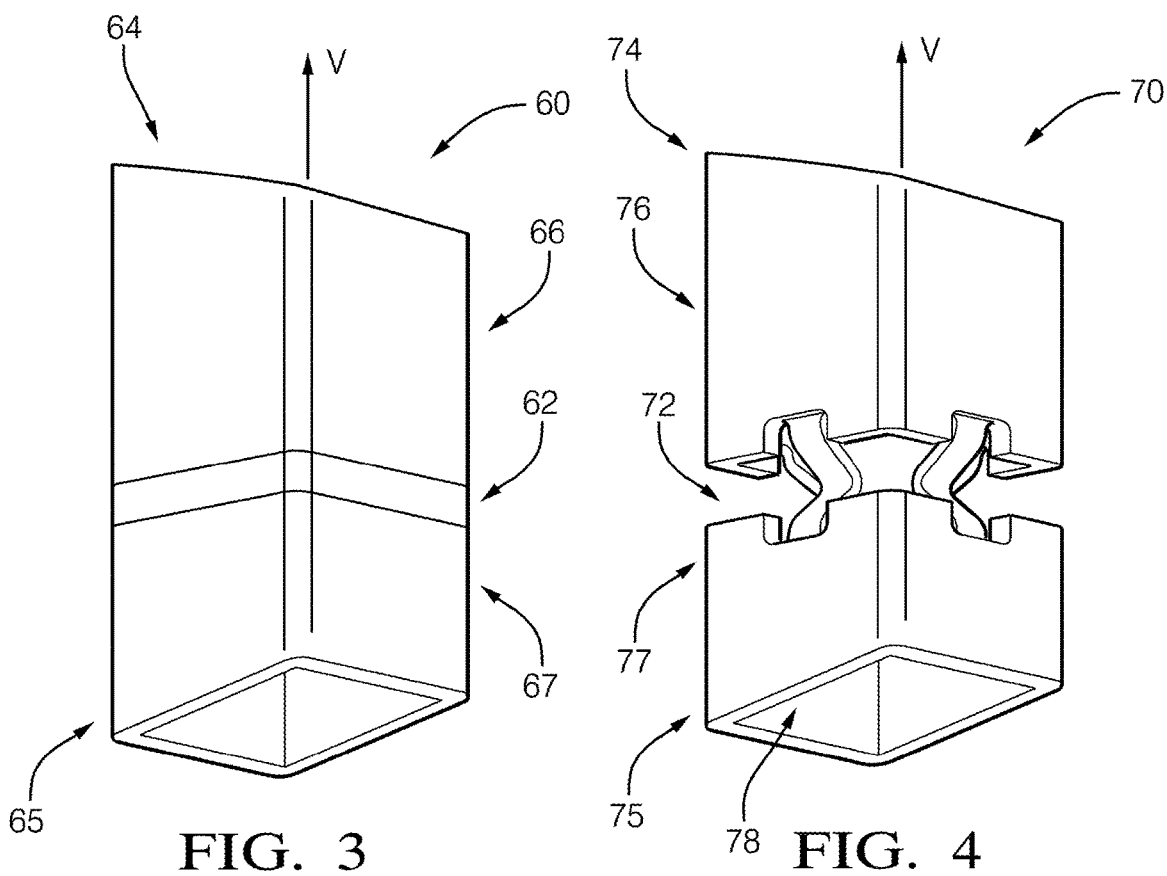
FIG. 3
FIG. 4
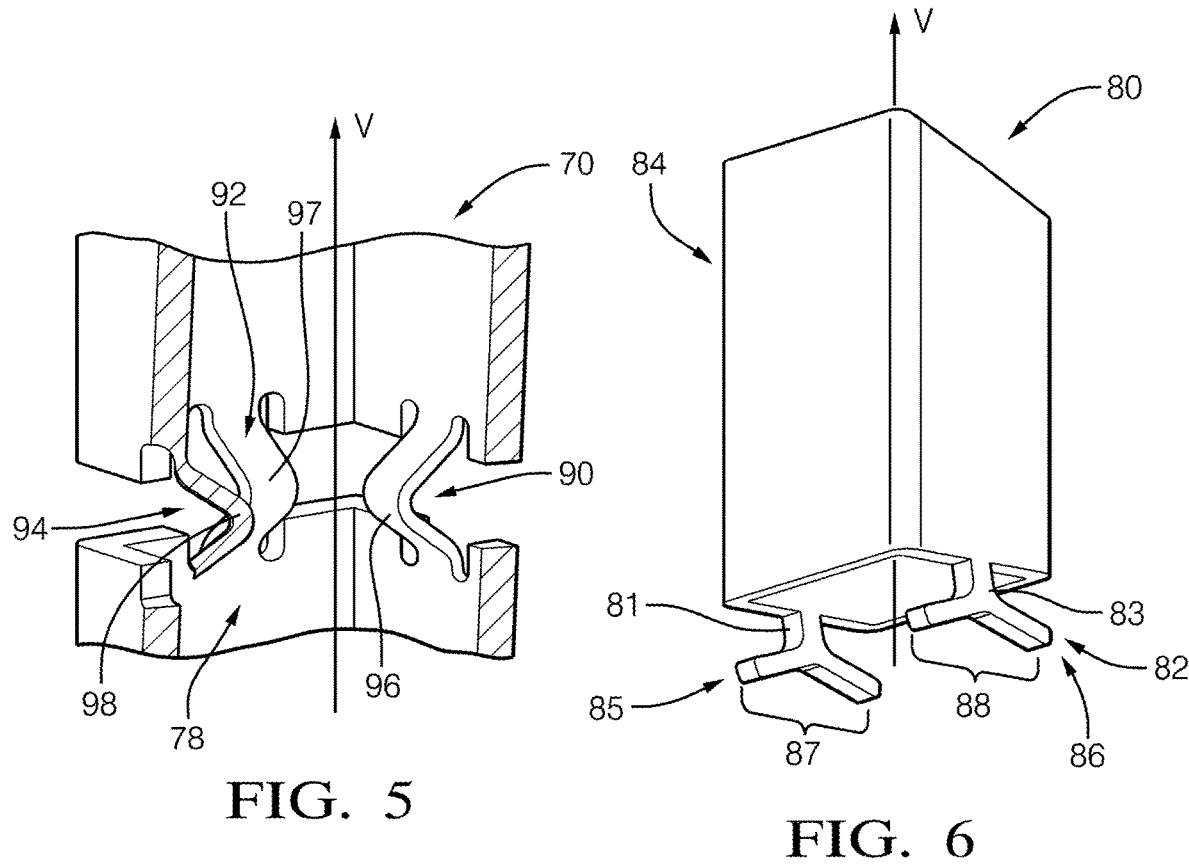
FIG. 5
FIG. 6

ILLUMINATED CONTROL PANEL CAPACITIVE SENSOR HAVING RIGID AND FLEXIBLE PORTIONS

CROSS-REFERENCE TO RELATED APPLICATION

This application claims the benefit under 35 U.S.C. § 119(a) of French Patent Application FR 1658013, filed Aug. 29, 2016, the entire disclosure of which is hereby incorporated herein by reference.

TECHNICAL FIELD OF INVENTION

The present invention concerns a motor vehicle control panel and more particularly a backlit control panel equipped with capacitive buttons.

BACKGROUND OF INVENTION

Control devices or control panels, both equipped with capacitive buttons, are known from the prior art. Such devices generally comprise a transparent front face painted on its rear surface and showing a plurality of functional pictograms indicating specific control zones. A capacitive film is applied against the rear surface of the front face so that the control zones form capacitive control buttons. An electronic printed circuit board is electrically connected to the capacitive film and includes means for monitoring the capacitive film. To backlight the pictograms light-emitting diodes are arranged on the printed circuit board. A spacer is generally placed between the capacitive film and the electronic printed circuit board in which are formed rectangular openings disposed facing the pictograms. Columns extend rearward from the perimeter of these openings with their free ends resting against the electronic circuit board and surround each of the light-emitting diodes. These columns make it possible to divide up the luminous flux produced by the diodes and to prevent light leaking into the whole of the control panel.

This type of control device with capacitive buttons requires complex assembly of various components based on different technologies, notably assembly of plastic parts such as the front face with a capacitive film. The capacitive film also represents a backlighting constraint, notably by virtue of its light propagation properties.

SUMMARY OF THE INVENTION

According to the invention, a motor vehicle control panel comprises a front face including a control zone, a printed circuit board, at least one electrically conductive capacitive detection element extending along a vertical axis from the rear surface of the front face to an electrical contact zone of the printed circuit board, a light source mounted on the printed circuit board and able to produce a back-lighting light beam toward the control zone through the capacitive detection element. The capacitive detection element comprises at least one rigid tubular part forming a light guide for the light beam and at least one elastic part made in one piece with the rigid tubular part so as to compensate the clearances between the rear surface and the detection element and between the printed circuit board and the detection element.

The rigid tubular part can preferably be an electrically conductive plastic. The capacitive detection element can comprise an elastic part arranged in bearing engagement with the electrical contact zone of the printed circuit board.

The capacitive detection element can comprise an elastic part arranged in direct contact bearing engagement with the rear surface of the front face.

According to one preferred embodiment, the detection element can comprise a single elastic part arranged between the axial ends of the detection element so that the tubular part is divided into a first portion and a second portion on respective opposite sides of the elastic part, the first and second portions being respectively in contact bearing engagement with the rear surface of the front face and in bearing engagement with the electrical contact zone of the printed circuit board. The elastic part can be a conductive elastomer collar over-molded with the rigid tubular part.

According to another embodiment, the elastic part can comprise an elastic shape made in one piece with the tubular part. The elastic shape can comprise at least one V-shaped leaf spring with the point of the V-shape oriented toward the interior of the cavity of the detection element, the leaf spring being arranged between the ends of the detection element so that the tubular part is divided into a first portion and a second portion on respective opposite sides of the leaf spring, the first and second portions being respectively in contact bearing engagement with the rear surface of the front face and in bearing engagement with the electrical contact zone of the printed circuit board. The elastic shape can have an inverted Y-shape, the inverted V-shaped part making the contact with the electrical contact zone of the printed circuit board, the vertical part of the inverted Y-shape making the connection between the tubular part and the elastic part.

The capacitive detection element can extend from the rear surface of the front face to the electrical contact zone of the printed circuit board in a direction oblique to the vertical axis.

Further features and advantages will appear more clearly on a reading of the following detailed description of the preferred embodiment, which is given by way of non-limiting example only and with reference to the accompanying drawings.

BRIEF DESCRIPTION OF DRAWINGS

Other features, objects and advantages of the invention will become apparent on reading the following detailed description with reference to the appended drawings, provided by way of nonlimiting example and in which:

FIG. 3 is a perspective view showing a capacitive detection element according to a second embodiment.

FIG. 4 is a perspective view showing a capacitive detection element according to a third embodiment.

FIG. 5 is a partial perspective view of the elastic part of the detection element from FIG. 4, seen from inside the cavity.

FIG. 6 is a perspective view showing a capacitive detection element according to a fourth embodiment.

DETAILED DESCRIPTION

Figure 1:
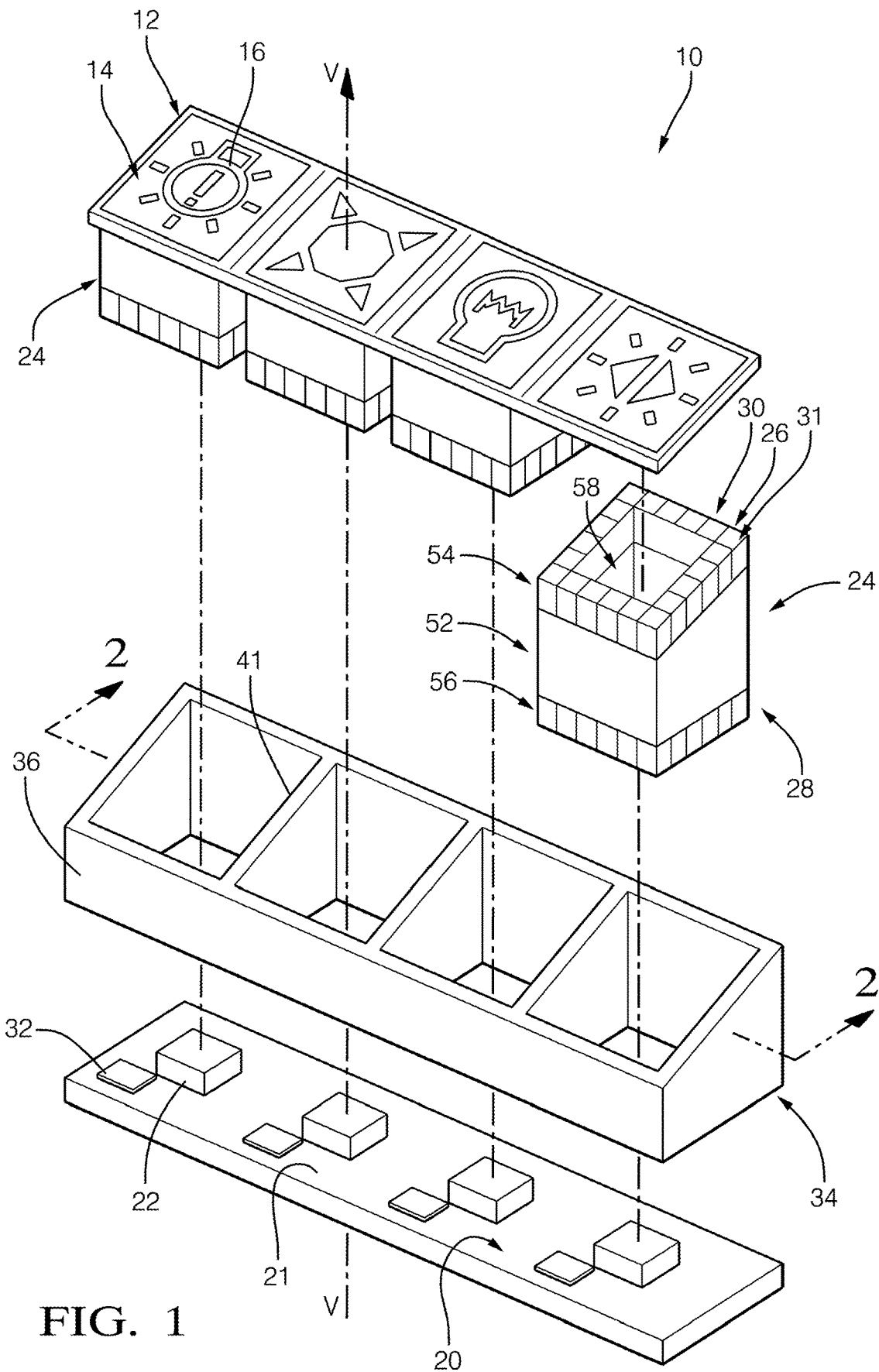
FIG. 1 is a perspective view of a motor vehicle control panel according to the invention comprising a first embodiment of the capacitive detection elements.
Figure 2:
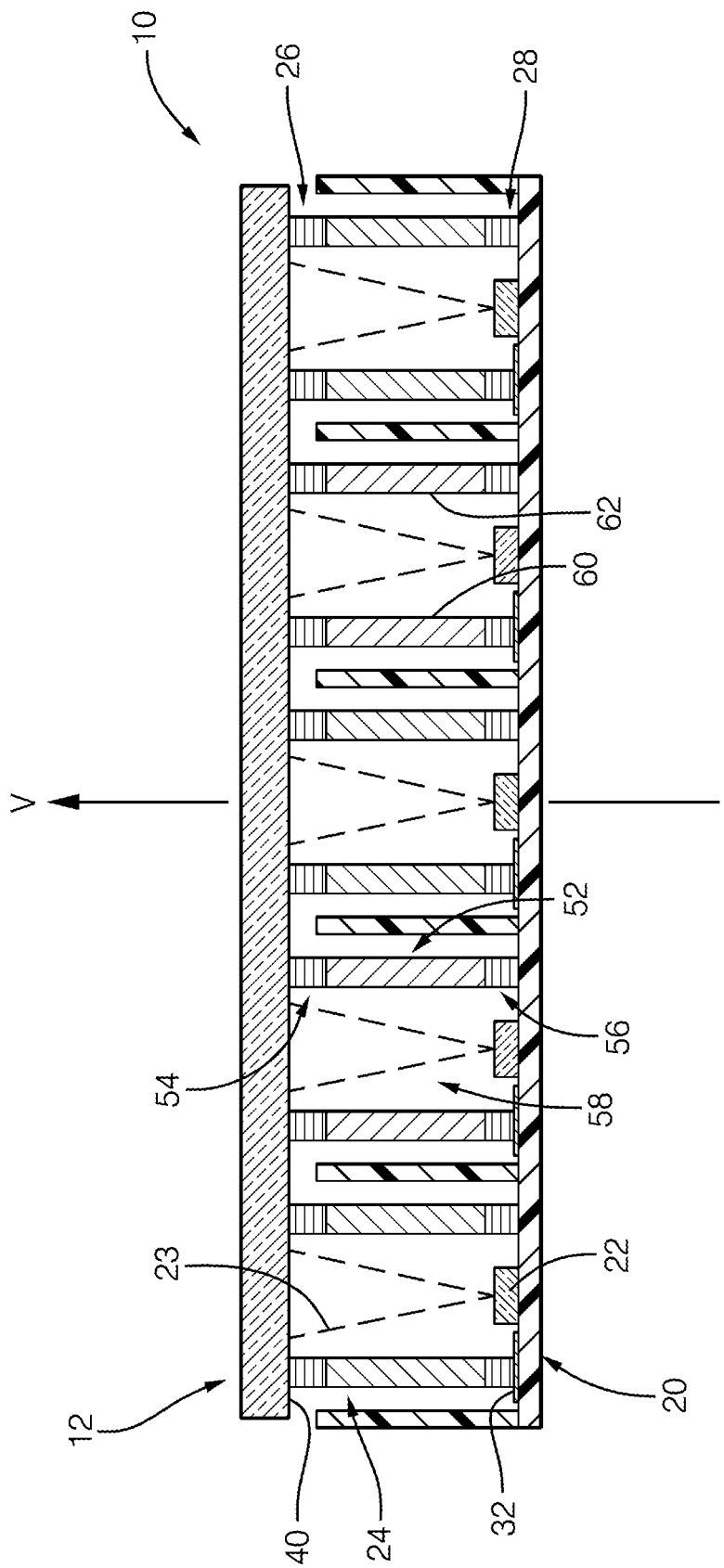
FIG. 2 is a diagrammatic view of the control panel from FIG. 1 in axial section taken along the line 2-2.

According to FIG. 1 and FIG. 2, a motor vehicle control panel 10 includes a front face 12 incorporating pictograms 16. By front face 12 is meant the face of the control panel 10 accessible to a user. Capacitive detection elements 24 are provided that are to be arranged against the rear surface 40 of the front face 12. The front face 12 preferably consists of a single component covering the capacitive detection elements 24. Alternatively, the front face 12 can consist of a plurality of components each covering one or more capacitive detection elements 24. The control panel 10 also comprises a printed circuit board 20 on which are disposed light sources 22 such as light-emitting diodes. The diodes, the capacitive detection elements 24, and the pictograms 16 are aligned on a vertical axis V so that the light sources 22 can produce a light beam 23 able to backlight the pictograms 16 through capacitive detection elements 24. The printed circuit board 20 comprises electrical contact zones 32 designed to be in electrical contact with the capacitive detection elements 24.

The pictograms 16 indicate control zones 14 which a user can press in order to trigger a function of the vehicle. The pictograms 16 can be produced by laser etching of the front face 12.

According to a first embodiment, each capacitive detection element 24 is of tubular shape. Each capacitive detection element 24 has a cross section of rectangular shape. Variants of the capacitive detection elements 24 having a cross section of circular or ellipsoidal shape can be envisaged. Each capacitive detection element 24 extends from the rear surface 40 of the front face 12 to the electrical contact zone 32 of the printed circuit board 20 along the vertical axis V. Each detection element 24 comprises a first axial end 26 in direct contact with the rear surface 40 of the front face 12 and a second axial end 28 in contact with an electrical contact zone 32 of the printed circuit board 20.

Each first end 26 includes a rim 30 the entire surface 31 of which is in direct contact with the rear surface 40 of the front face 12. The surface 40 of the rim 30 of each first end 26 is inclined relative to the surface 21 of the printed circuit board 20 so as to be essentially parallel to the rear surface 40 of the front face 12 that is inclined relative to the printed circuit board 20 and is therefore able to come entirely to bear on the rear surface 40 of the front face 12. When the front face 12 of the control panel 10 is parallel to the printed circuit board 20 the surface 31 of the rim 30 of each first end 26 is essentially parallel to the printed circuit board 20. The rim 30 of each first end 26 surrounds each control zone 14.

The capacitive detection elements 24 can optionally extend from the rear surface 40 of the front face 12 to the electrical contact zone 32 of the printed circuit board 20 in a direction oblique to the vertical axis V so as to be able to adapt to an arrangement in which the light sources 22 are not aligned vertically with the control zones 14.

According to the embodiment shown in FIGS. 1 and 2, each capacitive detection element 24 comprises a rigid tubular part 52 and also two electrically conductive elastic parts 54, 56.

Each rigid tubular part 52 has a cross section of rectangular shape. Variants of the rigid tubular parts 52 having a cross section of circular or ellipsoidal shape can be envisaged. Each rigid tubular part 52 includes a cavity 58 forming a light guide for the light source 22. The internal walls 60, 62 of the cavity 58 reflect light and do not allow light to spread outside the cavity 58. Each rigid tubular part 52 is an electrically conductive plastic part. These are preferably parts formed of plastic charged with metal particles such as aluminum, copper or zinc powder or flakes, for example.

Each electrically conductive elastic part 54, 56 takes the form of a collar arranged at each axial end 26, 28 of the tubular part 52 so as to compensate the clearances between the rear surface 40 and the detection element 24 and between the printed circuit board 20 and the detection element 24. In other words, one of the two elastic parts 54 is arranged in direct contact bearing engagement with the rear surface 40 of the front face 12, this elastic part 54 being the first end 26 of the capacitive detection element 24. The other elastic part 56 is arranged in direct contact bearing engagement with the electrical contact zone 32 of the printed circuit board 20, this elastic part 56 being the second end 28 of the detection element 24. Each electrically conductive elastic element 54, 56 makes it possible to compensate clearances resulting from the assembly or thermal expansion of the control panel 10, more particularly the tolerance in respect of the distance between the capacitive detection element 24 and the printed circuit board 20 and equally the distance between the capacitive detection element 24 and the rear surface 40 of the front face 12. This solution therefore makes it possible to guarantee electrical contact between the capacitive detection element 24 and the printed circuit board 20 and also between the capacitive detection element 24 and the rear surface 40 of the front face 12. Each elastic part 54, 56 of each detection element 24 enables the latter to remain pressed against the printed circuit board 20 and against the rear surface 40 of the front face 12.

The two elastic parts 54, 56 are made in one piece with the rigid tubular part 52. Each of the elastic parts 54, 56 takes the form of an electrically conductive elastomer, more particularly rubber, collar.

Each of the two elastic parts 54, 56 can preferably be over-molded with the rigid tubular part 52 or glued. Over-molding makes it possible to dispense with a gluing step, glue possibly reducing the capacitive detection sensitivity.

Although this is not essential to the invention, the control panel 10 from FIG. 1 also includes a casing 34. This casing 34 is designed to enclose the control panel 10. The casing 34 comprises a peripheral edge 36 designed to surround the printed circuit board 20 and extending vertically to the front face 12 so that the front face 12 can close the casing 34. The casing 34 also comprises opaque walls 41 arranged on the printed circuit board 20 and disposed between the light sources 22 so as to block any leaking of light from one light source 22 toward another and also to be able to retain the capacitive detection elements 24.

FIGS. 3, 4 and 6 show other nonlimiting embodiments of capacitive detection elements 60, 70, 80 according to the invention.

According to a second embodiment, the general geometrical shape of the capacitive detection element 60 shown in FIG. 3 differs from that in FIG. 1 in that it comprises only one elastic part 62 formed by an electrically conductive rubber collar. This collar is placed between the first end 64 and the second end 65 of the capacitive detection element 60, thus dividing the rigid tubular parts into a first portion 66 and a second portion 67 on respective opposite sides of the elastic part 62, the first portion 66 and the second portion 67 being respectively designed to be in contact bearing engagement with the rear surface 40 of the front face 12 and in bearing engagement with the electrical contact zone 32 of the printed circuit board 20.

According to a third embodiment the elastic part 72 of the capacitive detection element 70 shown in FIG. 4 is located on the detection element 70 in a similar manner to that shown in FIG. 3. However, differing in this respect from FIG. 3, the elastic part 72 is made in one piece with the first portion 76 and the second portion 77 of the rigid tubular part, i.e. preferably of electrically conductive rigid plastic. The elastic property of this rigid plastic elastic part 72 is produced by its particular shape. According to the embodiment shown in FIGS. 4 and 5, the elastic part 72 is formed by four V-shaped leaf spring (three springs 90, 92, 94 are shown in FIG. 5) respectively connecting each first portion 76 and second portion 77 of the four walls of the capacitive detection element 24, each point of the V-shape 96, 97, 98 of each of the springs 90, 92, 94 being oriented toward the interior of the cavity 78 of the detection element 70.

More generally, the first portion 76 and the second portion 77 of the rigid tubular part can be connected by one or more leaf springs made in one piece with the rigid tubular part.

According to a fourth embodiment and in the same way as in FIG. 4 the elastic part 82 of the capacitive detection element 80 shown in FIG. 6 is made in one piece with the rigid tubular part 84. However, FIG. 6 differs from FIG. 4 in that the elastic element 82 is at the end of the detection element 80 designed to be in contact with an electrical contact zone 32 of the printed circuit board 20. In other words, this elastic part 82 made in one piece with the tubular part 84 is designed to be maintained in compression bearing engagement with an electrical contact zone 32 of the printed circuit board 20. The elastic part 82 takes the form of two facing elastic elements 85, 86 continuous with two respective facing walls of the rigid tubular part 84. Each element 85, 86 has an inverted Y-shape, each inverted V-shaped part 87, 88 making the contact with the electrical contact zone 32 of the printed circuit board 20, each vertical part 81, 83 of the inverted Y-shape making the connection between the tubular part 84 and each elastic element 85, 86.

More generally, the rigid tubular part 84 can be electrically connected to an electrical contact zone 32 of the printed circuit board 20 by one or more leaf springs or elastic lugs 85, 86 made in one piece with the rigid tubular part 84.

The invention is not limited to the examples of detection elements shown but can encompass detection elements for which the tubular part can have a cross section of circular or other shape. The elastic shape of the elastic parts made in one piece with the rigid tubular part can equally be different from those shown; the essential function of the elastic part is to maintain the detection element pressed against the printed circuit board and against the rear surface of the front face of the control panel. The number of elastic parts can equally be greater than two if taking up assembly clearances between the detection elements and the control panel requires this.

While this invention has been described in terms of the preferred embodiments thereof, it is not intended to be so limited, but rather only to the extent set forth in the claims that follow.

We claim:

1. A motor vehicle control panel comprising:
   a front face that is part of a motor vehicle control panel including a control zone;
   a printed circuit board;
   at least one electrically conductive capacitive detection element extending along a vertical axis aligned with the control zone from the rear surface of the front face to an electrical contact zone of the printed circuit board; and
   a light source mounted on the printed circuit board and able to produce a back lighting light beam toward the control zone through the capacitive detection element, wherein
   the capacitive detection element comprises at least one rigid tubular part forming a light guide for the light beam and at least one elastic part made in one piece with the rigid tubular part so as to compensate the clearances between a rear surface and the detection element and between the printed circuit board and the detection element; wherein
   the elastic part comprises an elastic shape made in one piece with the tubular part, wherein the elastic shape has an inverted Y shape where two branches of the inverted Y shape make contact with the electrical contact zone of the printed circuit board, and the remaining vertical branch of the inverted Y shape makes the connection with the tubular part.

2. The control panel according to claim 1, wherein the rigid tubular part is an electrically conductive plastic.

3. The control panel according to claim 1, wherein the detection element comprises an elastic part arranged in bearing engagement with the electrical contact zone of the printed circuit board.

4. The control panel according to claim 1, wherein the detection element comprises an elastic part arranged in direct contact bearing engagement with the rear surface of the front face.

5. The control panel according to claim 1, wherein the detection element comprises a single elastic part arranged between axial ends of the detection element so that the tubular part is divided into a first portion and a second portion on respective opposite sides of the elastic part, the first portion and the second portion being respectively in contact bearing engagement with the rear surface of the front face and in bearing engagement with the electrical contact zone of the printed circuit board.

6. The control panel according to claim 1, wherein the elastic part is a conductive elastomer collar over-molded with the rigid tubular part.

7. The control panel according to claim 1, wherein the elastic shape comprises at least one V shaped leaf spring with the point of the V shape oriented toward the interior of the cavity of the detection element, the leaf spring being arranged between the ends of the detection element so that the tubular part is divided into a first portion and a second portion on respective opposite sides of the leaf spring, the first portion and the second portion being respectively in contact bearing engagement with the rear surface of the front face and in bearing engagement with the electrical contact zone of the printed circuit board.

8. The control panel according to claim 1, wherein the capacitive detection element extends in a direction oblique to the vertical axis from the rear surface of the front face to the electrical contact zone of the printed circuit board.

9. The control panel according to claim 1, wherein a user presses the control zone in order to trigger a function of the motor vehicle.

* * * * *